United States Patent [19]

Hatada et al.

[11] Patent Number: 5,089,772
[45] Date of Patent: Feb. 18, 1992

[54] DEVICE FOR TESTING SEMICONDUCTOR INTEGRATED CIRCUITS AND METHOD OF TESTING THE SAME

[75] Inventors: Kenzo Hatada, Katano; Takeshi Ishihara, Neyagawa; Nobuaki Suzuki; Satowaka Kuroda, both of Osaka, Japan

[73] Assignees: Matsushita Electric Industrial Co. Ltd., Osaka; Martec Corporation, Mino, both of Japan

[21] Appl. No.: 491,089

[22] Filed: Mar. 9, 1990

[30] Foreign Application Priority Data

Mar. 10, 1989 [JP] Japan ..................... 1-58426

[51] Int. Cl.$^5$ ............................................. G01R 31/02
[52] U.S. Cl. ............................ 324/158 F; 324/158 P
[58] Field of Search ............... 324/158 F, 158 P, 72.5, 324/537; 333/246, 248; 439/482; 437/8

[56] References Cited

U.S. PATENT DOCUMENTS

| | | | |
|---|---|---|---|
| 4,733,172 | 3/1988 | Smolley | 324/158 P |
| 4,820,976 | 4/1989 | Brown | 324/158 F |
| 4,849,689 | 7/1989 | Gleason et al. | 324/158 F |
| 4,906,920 | 3/1990 | Huff et al. | 324/158 F |
| 4,912,399 | 3/1990 | Greub et al. | 324/158 F |

*Primary Examiner*—Kenneth A. Wieder
*Assistant Examiner*—Vinh P. Nguyen
*Attorney, Agent, or Firm*—Sixbey, Friedman, Leedom & Ferguson

[57] ABSTRACT

Tests of a semiconductor IC is conducted first by bringing a plurality of conductive pattern circuits formed on an insulator sheet into contact with a plurality of bump electrodes formed on a substrate of the semiconductor, second by connecting a plurality of signal transmission pattern circuits formed on a transmission circuit substrate with each conductive pattern circuit of the insulator sheet, and then by connecting the transmission circuit substrate with a body of the testing device. A probing test can be simplified since there is no need to manually adjust positions of conventional probe needles. Further, semiconductor ICs having a lot of bump electrodes can be test without being damaged.

9 Claims, 10 Drawing Sheets

FIG. 2
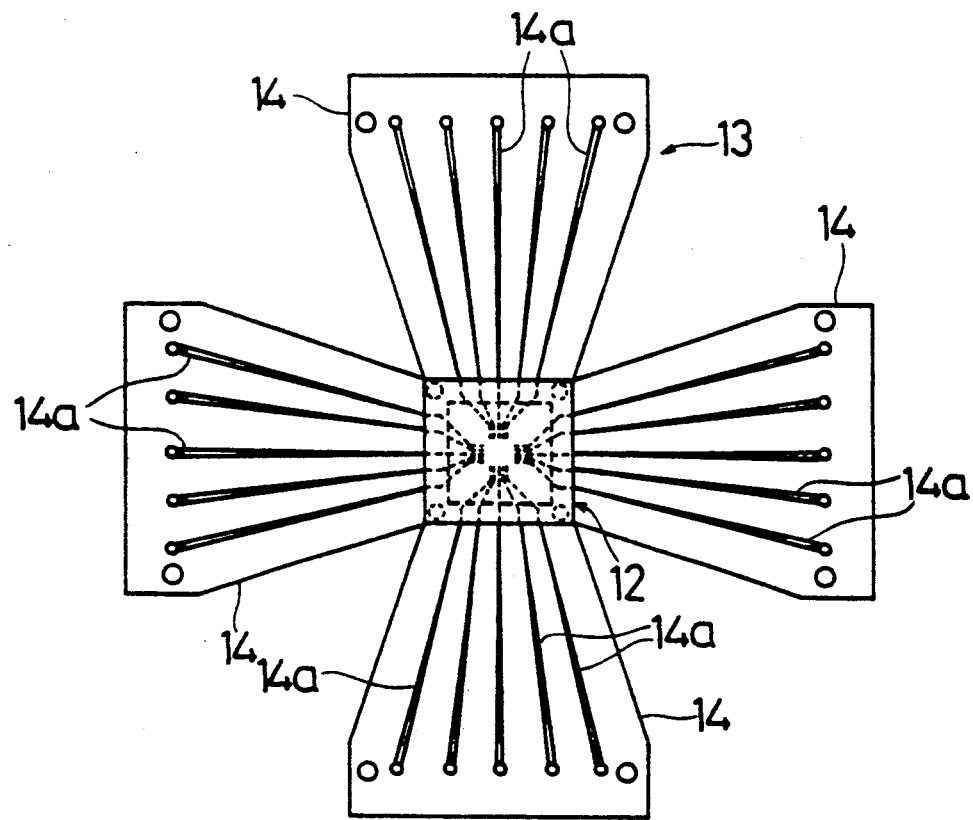
FIG.4
FIG.3
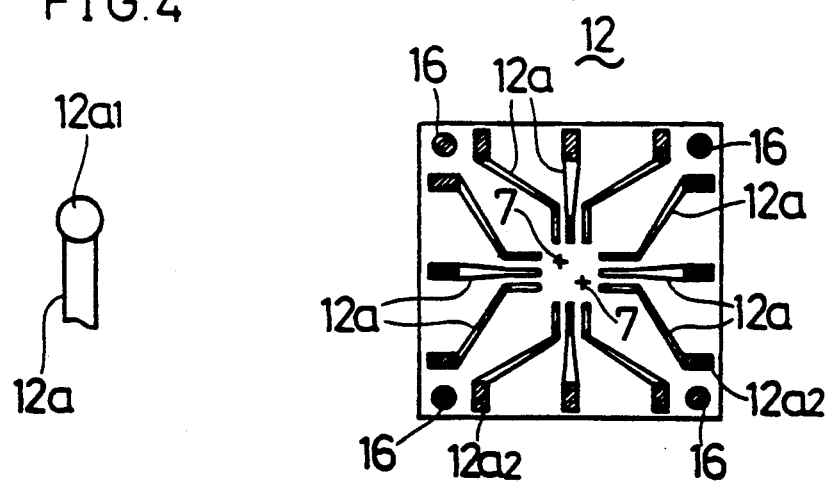

DEVICE FOR TESTING SEMICONDUCTOR INTEGRATED CIRCUITS AND METHOD OF TESTING THE SAME

BACKGROUND OF THE INVENTION

1. Field of the Invention

The present invention relates to a device for testing semiconductor integrated circuits and a method of testing the same, and more particularly to a device and a method for use in conducting the probe test of semiconductor integrated circuits in the form of semiconductor wafers or of semiconductor chips before packaging.

2. Description of the Prior Art

In conducting the probe test of a semiconductor integrated circuit (IC), probe cards having a plurality of probe needles corresponding to the number of electrodes of the semiconductor IC have been used conventionally. According to this conventional method and device, end portions of probe needles of the probe card are brought into contact respectively with corresponding aluminum electrodes of the semiconductor IC so as to enable the input and the output of test signals into the semiconductor IC, thus making the test of the semiconductor IC possible. The same approach of testing has been used for semiconductor ICs having metal bump on electrodes thereof.

However, with the increase of apparatus which use semiconductor ICs having metal bump on electrodes, problems have arisen. When using conventional probe cards for testing the function of semiconductor ICs having metal bump, it is necessary to adjust the positions of end portion of each probe needle as well as to design and manually assemble probe cards so that end portion of each probe needle accurately make contact with corresponding metal bump on electrodes. To this end, a lot of skilled workers are needed and production time increases with the resultant higher production cost. Furthermore, the recent rapid advance in the device technique has been making an assembly and adjustment of probe needles extremely difficult since the number of electrodes in semiconductor ICs is increasing and intervals therebetween is becoming more and more close. Another disadvantage is that probe needles are susceptible to wear, and gap of height therebetween or slippage of position thereof may occur with the passage of time since each probe needle is inclined at 7°~9° on a plane of semiconductor IC substrate. Yet another disadvantage is that metal bump of semiconductor ICs are easily scratched and damaged due to the contact with end portions of probe needles. As a result, improper contact may occur at the subsequent step of bonding lead to semiconductor ICs. In addition, favorable high frequency characteristic cannot be achieved since the use of probe needles induces noise interference.

SUMMARY OF THE INVENTION

It is therefore an object of the present invention to provide a device and a method which can facilitate probe tests of semiconductor ICs having many as well as metal bump on electrodes or metal bump without using probe needles.

To attain the above-mentioned object, the present invention is to carry out probe tests by forming conductive pattern circuits on an insulator instead of using probe needles in order to allow the input and output of test signals into semiconductor ICs.

More specifically, the present invention is to provide a device for testing semiconductor ICs wherein a plurality of electrode bumps are formed on substrate thereof. The testing device comprises: an insulator sheet having a plurality of conductive pattern circuits which make contact respectively with corresponding bump electrodes of the semiconductor IC; and a transmission circuit substrate having a plurality of signal transmission pattern circuits which are connected with corresponding conductive pattern circuits on the insulator sheet and are disposed in parallel or radially. The above-mentioned transmission substrate is connected with a body of the testing device.

Further, the present invention is to provide a method of testing a semiconductor IC comprising steps of: bringing a plurality of conductive pattern circuits formed on an insulator sheet into contact respectively with a plurality of electrode bumps formed on a substrate of semiconductor IC; connecting a plurality of signal transmission pattern circuits formed on a transmission circuit substrate respectively with the conductive pattern circuit on the insulator sheet; and connecting the transmission circuit substrate with a body of the testing device.

With the above features of the present invention, electrode bumps of semiconductor IC are connected with the body of the testing device through corresponding conductive pattern circuits on the insulator sheet and corresponding signal transmission pattern circuits on the transmission circuit substrate so as to allow the input and output of test signals, thereby making the test of semiconductor ICs possible.

Since the conductive pattern circuits and the signal transmission pattern circuits are formed respectively on the insulator sheet and the transmission circuit substrate, no slippage of positions occurs. Accordingly, conventional manual adjustment such as positioning the end portions of probe needles will no longer be necessary, thus simplifing and facilitating the probe tests. Further advantage obtained in the invention is that semiconductor ICs having a lot of electrode bumps with diameters of approximately 10 $\mu$m and line intervals of approximately 5 $\mu$m can easily be tested since the line width of the conductive pattern circuits and the signal transmission pattern circuits can be made into around 10 $\mu$m when using techniques of photolithography etching.

Compared with probe needles, pattern circuits are less susceptible to wear. Furthermore, electrode bumps will not be scratched since probe needles are not used in the invention, thus enabling smooth bonding at the next step. Conductive pattern circuits can easily be designed and produced to be in curved shapes in addition to linear ones. Therefore, the present invention can be applicable to semiconductor ICs having multiple-structured electrode bumps wherein electrode bumps are disposed both at the inner and at the outer periphery of the substrate.

In case of testing semiconductor ICs without electrode bumps, the probing test can be possible if providing conductive pattern circuits on an insulator sheet for testing with bumps. However, this method will lead to shorter service life of an insulator sheet for testing since bumps are increasingly subject to wear due to repeated contacts with many semiconductor ICs being tested. In contrast, electrode bumps are formed on semiconductor ICs in the present invention. Accordingly, bumps are less susceptible to wear since parts repeatedly making contact with semiconductor ICs are plane conductive pattern circuits. In addition, inspection of shapes of electrode bumps can be carried out simultaneously with the testing of semiconductor ICs. Electrode bumps which do not reach the fixed dimension can be found when bringing the conductive pattern circuits into parallel surface-to-surface contact with the semiconductor IC since they do not make proper contact with conductive pattern circuits. In this way, in the present invention, properly-functioning semiconductor ICs with electrode bumps of appropriate shapes can be separated from improper ones simultaneously.

The above and novel features of the invention will become more apparent from the following detailed description of preferred embodiments making reference to the accompanying drawings.

BRIEF DESCRIPTION OF THE DRAWINGS

The accompanying drawings show preferred embodiments of the present invention, in which:

FIG. 2 is a plan view of an insulator sheet and a transmission circuit substrate both for normal range;

FIG. 3 is a bottom plan view of the insulator sheet for normal range;

FIG. 4 is a view showing a pad at the end portion of a conductive pattern circuit;

FIG. 12 is a bottom plan view;

FIG. 13 is a side view;

FIG. 14 is a side view when a filler is used;

DETAILED DESCRIPTION OF THE PREFERRED EMBODIMENT

Figure 1:
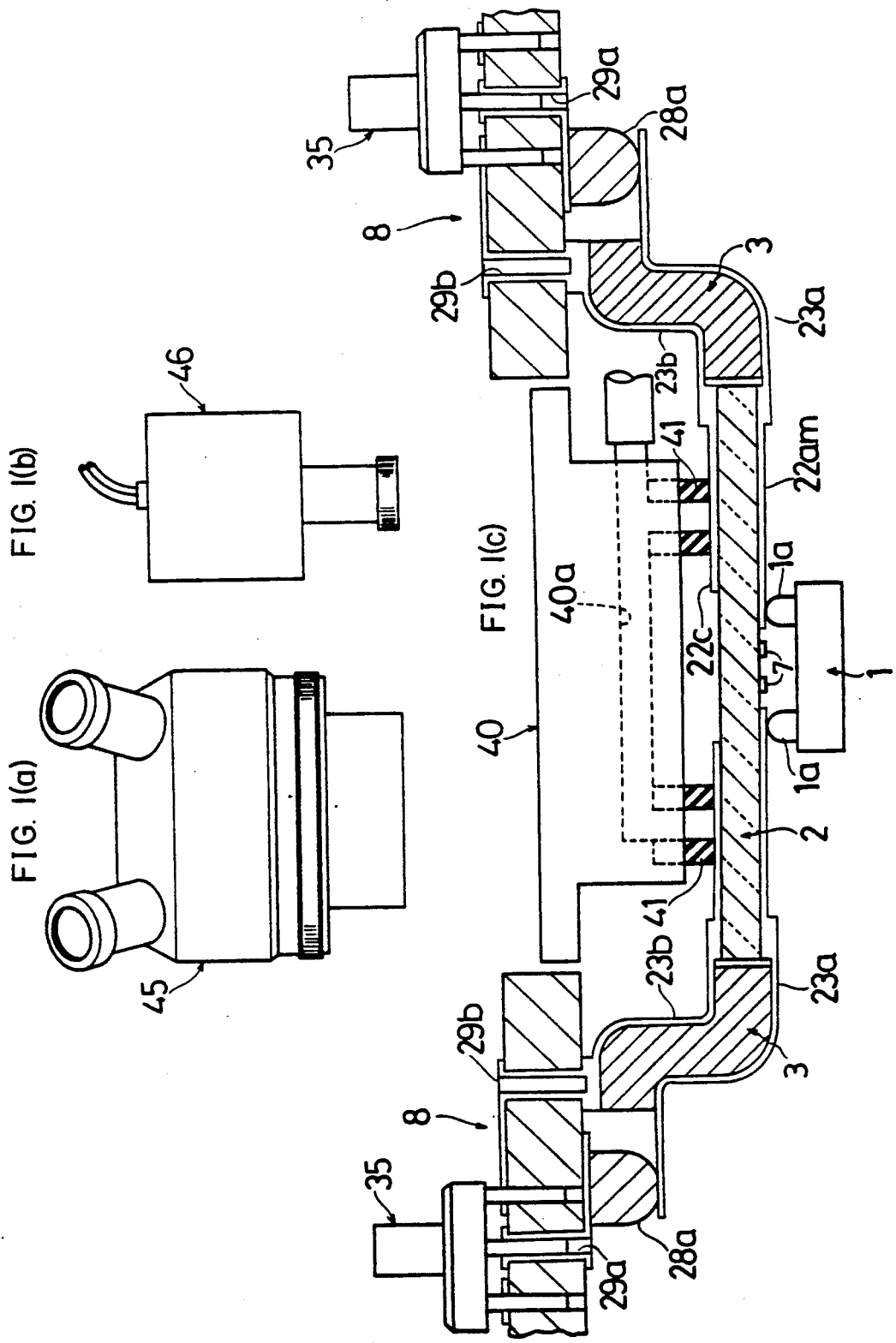
FIGS. 1a-1b show a microscope and a TV camera respectivly.
FIG. 1c is a sectional view of a testing device for semi-semiconductor ICs for measuring high frequency, showing an over-all rough construction thereof.

The present invention will now be described with reference to the preferred embodiments thereof, and in conjunction with the appended drawings.

FIG. 1c shows an overall rough construction of a testing device of semiconductor ICs. In FIG. 1c reference numeral 1 designates a semiconductor IC to be tested. A plural number of electrode bumps 1a composed of metals such as gold are originally or specially formed for the probing test with the present testing device on the upper periphery area of a semiconductor substrate of the semiconductor IC 1.

Reference numerals 2 and 3 designate respectively an insulator sheet located in the upper position of the semiconductor IC 1, and a transmission circuit substrate connected with the insulator sheet 2. The transmission circuit substrate 3 includes a normal range type substrate 13 and a high frequency type substrate 23. FIG. 1 employs substrate 23 for measuring high frequency. The insulator sheet 2 also includes a normal range type insulator sheet 12 and a high frequency type insulator sheet 22. (FIG. 1c adopts the insulator sheet 22 for measuring high frequency.) First, referring to FIG. 3, the insulator sheet 12 for normal range will be described. The insulator sheet 12 of a square shape is a transparent insulator, such as a glass, having size of 10 to 80 mm and thickness of 0.05 to 3 Formed on the bottom surface of the insulator sheet 12 are conductive pattern circuits $12a$ corresponding to the number of the electrode bumps $1a$ of the semiconductor IC 1. Each conductive pattern circuit $12a$ extends from the outer periphery to the inner portion on the insulator sheet 12. The central co-ordinate position of end portions of each conductive pattern circuit $12a$ on the insulator sheet 12 coincide with that of each electrode bump $1a$ of the semiconductor IC 1 so as to facilitate smooth contact between each corresponding conductive pattern circuit $12a$ and electrode bump $1a$. As shown in FIG. 4, each conductive pattern circuit $12a$ of the insulator sheet 12 has, at the inner end portion thereof, circular pads $12a_1$ in order to promote smooth contact with the electrode bumps $1a$, and at the outer end portion thereof, bumps $12a_2$ as connecting terminals with the transmission circuit substrate 3. The each conductive pattern circuit $12a$ and pad $12a_1$ at the inner end portions thereof are composed of one or plural kinds of metal conductors such as nickel, chrome, copper, aluminum and gold, and more preferrably a transparent conductor such as indium titanium oxide (I.T.O.). The bumps $12a_2$ at the outer end portions of the conductive pattern circuits $12a$ are composed of the above-mentioned metal conductor. Width of the inner and the outer end portions of each conductive pattern circuit $12a$ are respectively 0.01 to 0.3 mm and 0.05 to 0.3 mm. Inner end portions of the conductive pattern circuits $12a$ are spaced at intervals of not less than 0.005 mm. Formed within the plane area enclosed by pads $12a$, at the inner end portions of conductive pattern circuits 12a as well as on the bottom surface of the insulator sheet 12 are two positioning alignment targets 7, 7 of cross-shape. The alignment targets 7, 7 and the semiconductor IC 1 are automatically positioned by aligning two reference positions of the alignment targets 7, 7 and the semiconductor IC 1.

Figure 5:
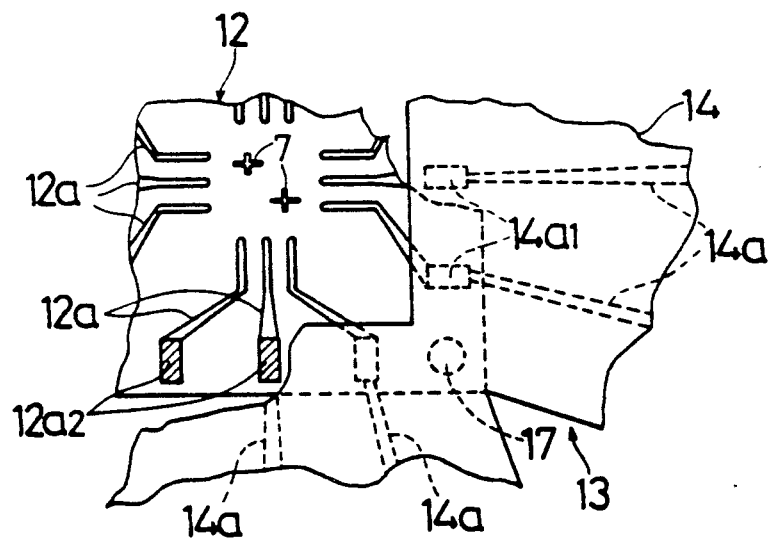
FIG. 5 is a partly enlarged view of connections between the insulator sheet and the transmission circuit substrate both for normal range.

Referring to FIG. 2, the transmission circuit substrate in use with the insulator sheet 12 for normal range is of substantially cross shape and composed of a transparent polyimide film. Disposed at the central space of the transmission circuit substrate 13 is the insulator sheet 12. The transmission circuit substrate 13 comprises, as a one-piece unit, four flexible print circuit substrates 14 which correspond with four sides of the insulator sheet 12. Provided on the surface of each print circuit substrate 14 are a plurality of signal transmission pattern circuits 14a which extend radially. As shown in FIG. 5 of the enlarged view, bumps 14a, are formed at the inner end portions of the signal transmission pattern circuits 14a as connecting terminals with the outer bumps $12a_2$ of the conductive pattern circuit 12a of the insulator sheet 12. The bumps 14a, are composed of metal conductors such as copper, nickel and gold.

Figure 6:
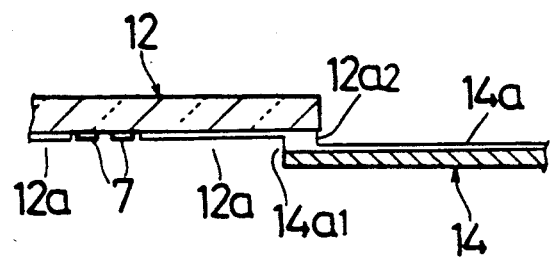
FIG. 6 is a side view similar to FIG. 5.

As shown in FIG. 6, the insulator sheet 12 and four print circuit substrates 14 connect the conductive pattern circuit 12a with the signal transmission pattern circuit 14a by achieving contact between the connecting terminals of bukmps $12a_2$ and corresponding bumps $14a_1$. As shown in FIG. 3, connecting portion reinforcement patterns 16 are provided at each angular area of the insulator sheet 12. The reinforcement patterns 16 of circular shape are plated with soldering. Similarly, as shown in FIG. 5, connecting portion reinforcement patterns 17 are provided on the transmission circuit substrate 13 at the portions thereof corresponding to the reinforcement patterns 16. The conductive pattern circuits 12a and the signal transmission pattern circuit 14a are firmly connected by these reinforcement patterns 16, 17.

Figure 7:
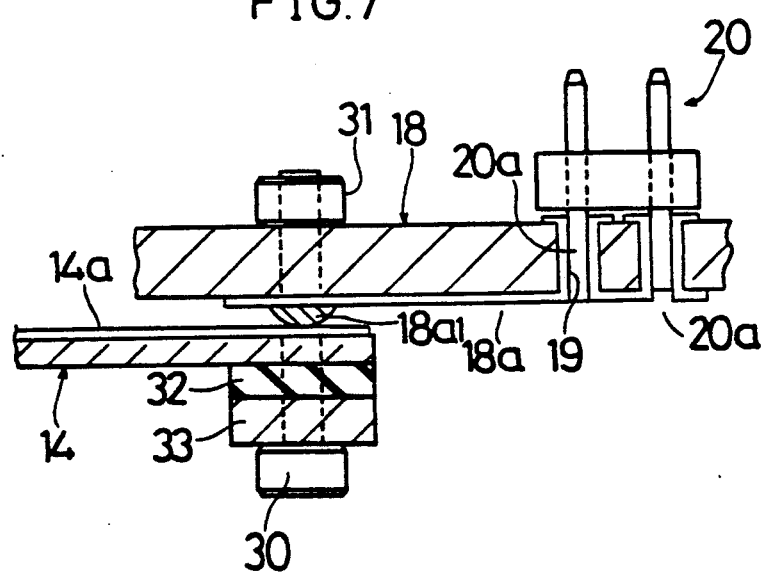
FIG. 7 is a partly diagrammatic sectional view showing connections between the transmission circuit substrate and a connecting print substrate both for normal range.

In FIG. 1c, reference numerals 8 designate connecting print substrates. (The connecting print substrates 8 include a normal range type substrate 18 and a high frequency type substrate 28. FIG. 1 adopts the substrate 28.) Each print circuit substrate 14 is connected with the body of the testing device (not shown in the drawings) by means of this connecting print substrates 8. In detail, as also shown in FIG. 7, the connecting print substrates 18 for normal range has a plurality of circuit patterns 18a on the bottom surface thereof. End portions of each circuit pattern 18a have bumps $18a_1$. The connecting print substrate 18 is connected with the print circuit substrate 14 by means of a pair of fixing screws 30 and a nut 31 while the bumps $18a_1$ make contact with the portions of the corresponding signal transmission pattern circuit 14a on the top surface of the print circuit substrate 14. Each circuit pattern 18a is connected with corresponding through-hole 19. Pins 20a of a connector 20 are inserted respectively to each through-hole 19. The connector 20 is connected with the body of the testing device. In FIG. 7, reference numerals 32, 33 designate respectively an elastic rubber, such as a silicon rubber, inserted in the fixing screw 30, and a fixing plate.

Figures 8A, 8B:
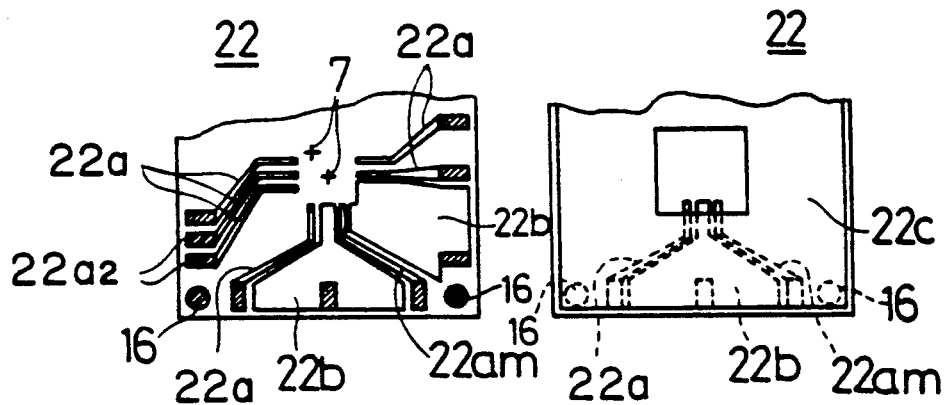
FIGS. 8(a) and (b) are views respectively showing a bottom surface and a top surface of an insulator sheet for measuring high frequency.

FIG. 8 shows an insulator sheet 22 for measuring high frequency. As shown in FIG. 8(a), ground conductors 22b are provided on both sides of conductive pattern circuit 22am for measuring high frequency on the back side of the insulator sheet 22 so as to enclose the conductive pattern circuit 22am. As shown in FIG. 8(b), the top surface of the insulator sheet 22 is entirely covered with a ground conductor 22c except the central portion. By selecting an insulator sheet 22 having an appropriate dielectric constant or varying a line width of a conductive pattern circuit 22am, a microstrip line 25 having impedance characteristic of, for example, 50 106 is formed. The central part of the ground conductor 22c on the top surface of the insulator sheet 22 forms an opening so that the pads at the inner end portions of the conductive pattern circuits 22am on the botton surface can be observed for inspection. Since other constructions of the insulator sheet 22 are similar to those of the normal type insulator sheet 12, description is omitted while just indicating the same portion with the same reference numerals as the insulator sheet 12.

Figure 9:
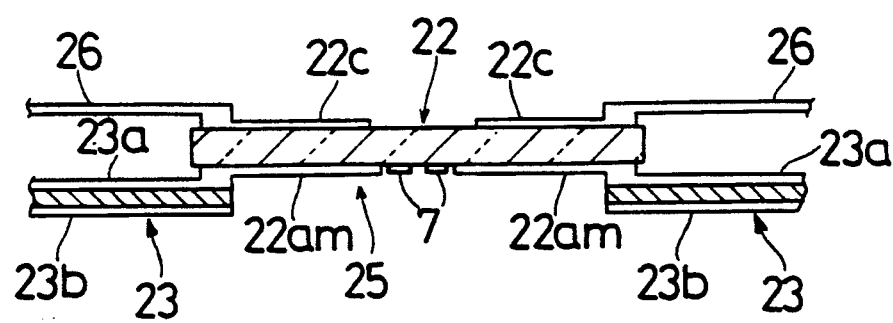
FIG. 9 is a sectional view showing connections between an insulator sheet and a transmission circuit substrate both for measuring high frequency.

FIG. 9 shows connections between the insulator sheet 22 and the transmission circuit substrate 23 both for measuring high frequency. As shown in FIG. 9, the transmission circuit substrate 23 has, on the top surface thereof, a strip circuit 23a, and on the bottom surface thereof, a ground conductor 23b. The strip circuit 23a is connected with the conductive pattern circuit 22am of the insulator sheet 22. Disposed in the upper position as well as in parallel with the transmission circuit substrate 23 is a ground conductor sheet 26 which is connected with a ground conductor 22c on the top surface of the insulator sheet 22.

Figure 10:
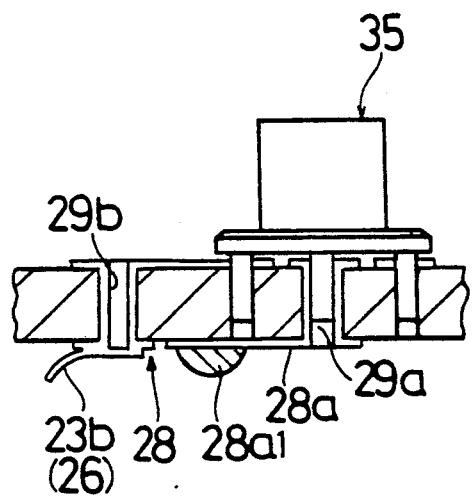
FIG. 10 is a sectional view of a connecting print substrate for measuring high frequency.

FIG. 10 shows a construction of a connecting print substrate 28 for measuring high frequency. As shown in FIG. 10, a plurality of circuit patterns 28a formed on the bottom surface on the connecting print substrate 28 make contact, at bumps $28a_1$ formed on the end portion thereof, with the signal transmission pattern circuit 23a on the top face of the transmission circuit substrate 23 in a similar manner shown in FIG. 7. A through-hole 29a for singals linked with each circuit pattern 28a is connected with a signal terminal of a coaxial connector 35 while a through-hole 29b for grounding is connected with the ground conductor 23b of the transmission circuit substrate 23 and the ground conductor sheet 26. The through-hole 29b is connected with a ground terminal of the coaxial connector 35.

Figure 11:
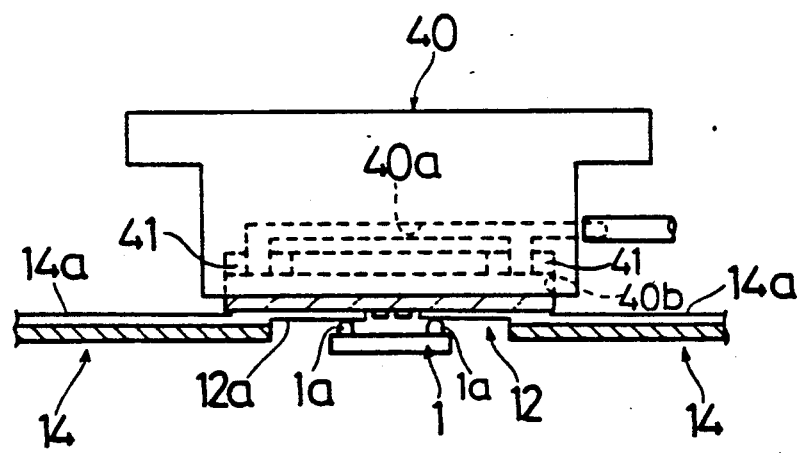
FIG. 11 is a view of an alternate form showing a construction wherein an insulator sheet is absorbed by a pressing tool.

Referring to FIG. 1c, a transparent pressing tool 40 is mounted in the upper position of the insulator sheet 2. The pressing tool 40 is equipped with an absorption pipe 40a which vacuum-absorbs the insulator sheet 2 by means of an elastic rubber 41. While the absorption pipe 40a vacuum-absorbs the insulator sheet 2, the pressing tool 40 disposes the insulator sheet 2 in the horizontal position as well as adjust the contact pressure between the insulator sheet 2 and each electrode bump 1a of the semiconductor IC 1 at a proper value. As shown in FIG. 11, the pressing tool 40 can be provided with a recess 40b with which the insulator sheet 2 (the normal type insulator sheet 12 is shown in FIG. 11) is fitted. Vacuum-absorbing the insulator sheet 2 while the insulator sheet 2 is fitted to the recess 40b will lead to more accurate positioning of the insulator sheet 2.

Referring to FIGS. 1a–1b, a microscope 45 and a TV camera 46 are provided in the upper position of the pressing tool 40. The microscope 45 and the TV camera 46 enable the operator to observe and check the contact between each conductive pattern circuit 12a (or 22a) of the insulator sheet 12 and corresponding electrode bumps 1a of the semiconductor IC 1 through the transparent pressing tool 40 and the also transparent insulator sheet 2. Accordingly, the insulator sheet 12 can be positioned accurately.

More specifically, in the above embodiment, in the case of using the insulator sheet 22 for measuring high frequency, each electrode bump 1a of the semiconductor IC 1 is connected with the body of the testing device in the following manner. First the semiconductor IC 1 is disposed in the lower position of the insulator sheet 22. Then, while observing and checking with the microscope 45 and TV camera 46, each electrode bump 1a of the semiconductor IC 1 is brought into contact with corresponding conductive pattern circuit 22a of the insulator sheet 22. At the same time, each conductive pattern circuit 22a of the insulator sheet 22 is connected, in order, with corresponding signal transmission pattern circuit 14a of each print circuit substrate 14, pattern circuit 28a of the connecting print substrate 28, and then the coaxial connector 35 having a plurality of pins, and finally with the body of the testing device. Thus, the signals can be inputted into or outputted from the semiconductor IC 1, thereby making possible the probing test of the semiconductor IC 1. The semiconductor IC 1, if checked with the probing test that function thereof is normal, is packaged after each electrode bump 1a thereof is bonded to the designated terminals on the packaging substrate.

In hte present invention, parts which make contact with each electrode bump 1a of the semiconductor IC 1 are the conductive circuits 22a formed on the insulator sheet 22. therefore, the testing device of the present invention can be easily produced without the help of skilled workers. Furthermore, since there will be no movable portion such as conventional probe needles, adjustment of the positions is unnecessary, whereby simplifying the probing test process.

Line width of the inner end portions of the conductive pattrn circuit 22a of the insulator sheet 22 can range from 10 to 300 $\mu$m. Accordingly, when adjusting the line width of the inner end portions to approximately 10 $\mu$m, the probing test can be easily conducted even if diameter of each electrode bump 1a of a semiconductor IC 1 is about 10 $\mu$m and spacing threbetween is about 5 $\mu$m.

Parts which make contact with each electrode bump 1a of the semiconductor IC are plane pattern circuits 22a. This means that the pattern circuit 22c is more resistant to wear compared with conventional probe needles, thereby protecting each electrode bump 1a from scratches. In this way, after the probing test, bonding process such as bonding of lead wiring to each electrode bump of the semiconductor IC of good qualilty can be achieved without any problem in the next step.

In the case of testing an individual semiconductor IC in the form of chips after cutting wafers, testing can be carried out on the same processing line for sealing of semiconductor IC 1, i.e. packaging step. Accordingly, marking of defective knits in the case of conducting the test in the form of wafers, or selection of defective units from proper ones after cutting wafes is unnecessary. Thus, testing cost can be kept minimal.

When prove-testing semiconductor ICs without electrode bumps, each conductive pattern circuit 22a of the insulator sheet 22 may be provided with bumps. However, these bumps will be increasingly subject to wear because of repeated contact with semiconductor ICs being tested in sequence. Accordingly, the insulator sheet must be replaced frequently. On the other hand, in the testing device of the present invention, the plane conductive pattern circuits 22a make contact with each electrode bump 1a of the semiconductor IC 1. Therefore, long service life of the insulator sheet for testing use is guaranteed since wear of the conductive pattern circuit 22a is kept minimal, thereby increasing efficiency of the operation of the testing device and the testing itself.

In the present invention, testing is conducted by bringing the insulator sheet 22 into parallel face-to-face contact with the semiconductor IC 1. This means that electrode bumps 1a which are not at the fixed height (or smaller than the fixed height) do not make contact with corresponding conductive pattern circuit 22a. Accordingly, in this invention, shape test of semiconductor ICs can be conducted simultaneously to determine and select proper semiconductor ICs both in terms of shape and junction.

The insulator sheet 22 for measuring high frequency is provided, on one side (back face), the conductive pattern circuits 22a, and on the other side (top surface), the ground conductor 22c, thus forming a microstrip line 25. As a result, damping of high frequency signals or effect of noise can be curbed, therby achieving higher transmission characteristic of high frequency and more accurate measurement.

In this invention, the insulator sheet 22 is composed of a transparent glass. In addition, the conductive pattern circuits 22a and the inner end pads $22a_1$ thereof are also composed of a transparent body such as I.T.O. This makes possible the observation and verification of contact between the inner end pads $22a_1$ of each conductive pattern circuit 22a and each electrode bump 1a of the semiconductor IC 1. Thus, the semiconductor IC can be positioned properly and easily.

Figure 12:
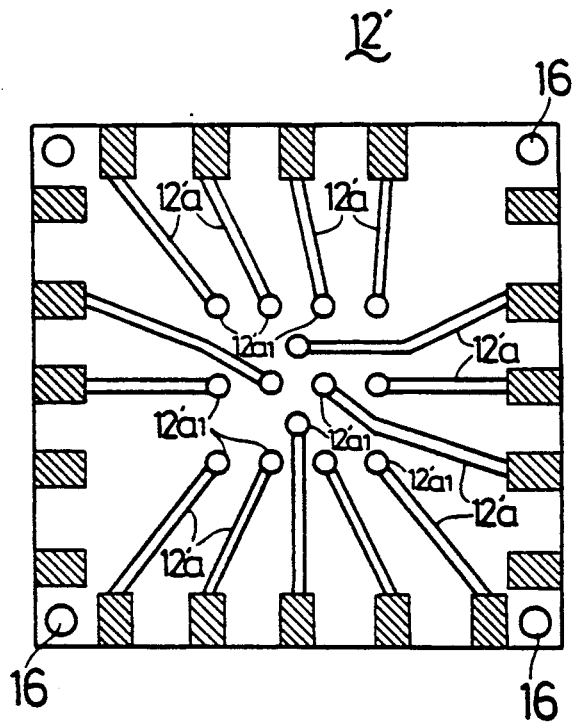
FIGS. 12 through 14 show alternate forms of an insulator sheet for normal range.
Figure 13:
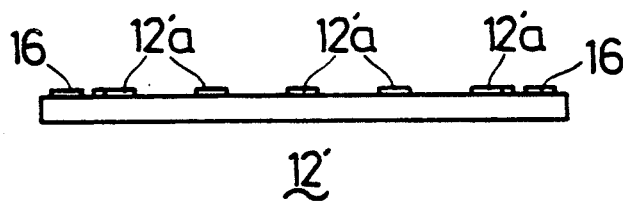
Figure 14:
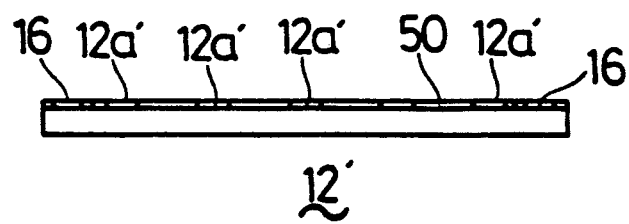

FIG. 12 shows an alternate form of the insulator sheet 12 for normal range. The insulator sheet 12' is applicable to a multiple-structured semiconductor ICs wherein electrode bumps are disposed in the inner periphery thereof in addition in the outer periphery on a substrate. Corresponding to the structure of the semiconductor IC to be tested, the inner end pads $12a'_1$ of each conductive pattern circuit 12'a are disposed, 10 of them in the outer periphery and four of them in the inner periphery. In the conventional method, probe needles must be arranged stereoscopically, which is practically impossible. However, in the present invention, some of the conductive pattern circuits 12a' can be bended on the plane as shown in FIG. 12 to meet the requirement of semiconductor ICs having multiply-disposed electrode bumps. As shown in FIG. 13, the insulator sheet 12' will have the structure that each conductive pattern circuit 12a' slightly projects from the plane surface. However, as shown in FIG. 14, a surface of the insulator sheet 12' can be plane by packing a filler 50 between each pattern circuit 12a'.

Figure 15A:
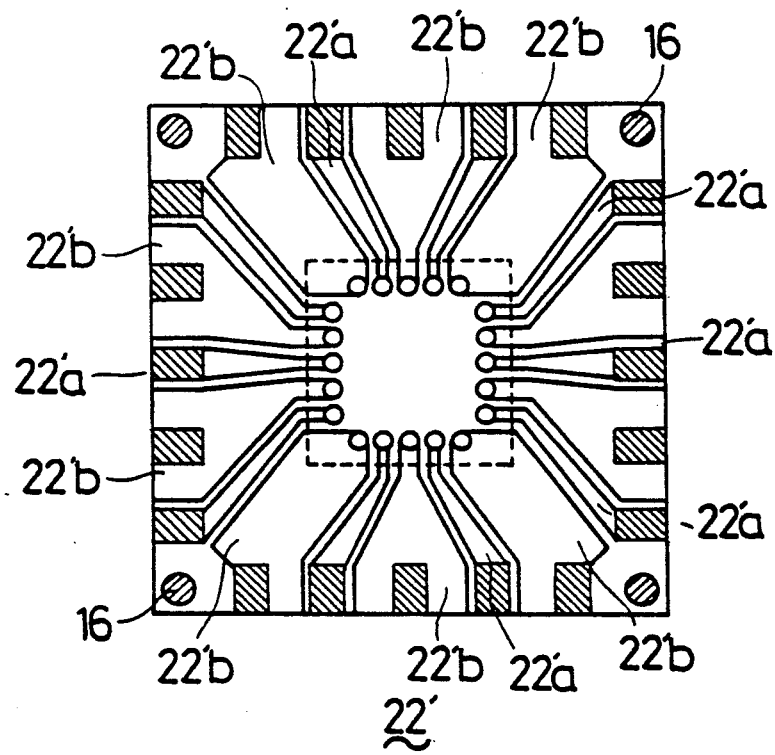
FIGS. 15(a) and (b) are respectively a plan view and a bottom plan view showing alternate forms of the insulator sheet for measuring high frequency.
Figure 15B:
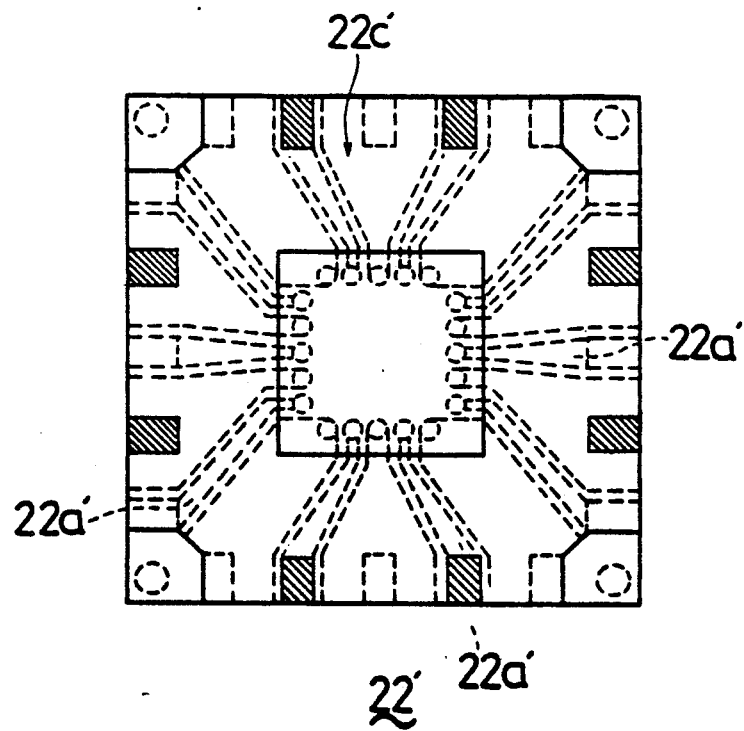

FIG. 15 shows an alternate form of an insulator sheet for measuring high frequency. FIG. 15(a) illustrates the back face of the insulator sheet 22' wherein ground conductors 22'b are provided at every space between the conductive pattern circuits 22'a. FIG. 15(b) illustrates the top surface of the insulator sheet 22' wherein ground conductors 22'c are provided on the entire surface except the central portion.

Figure 16:
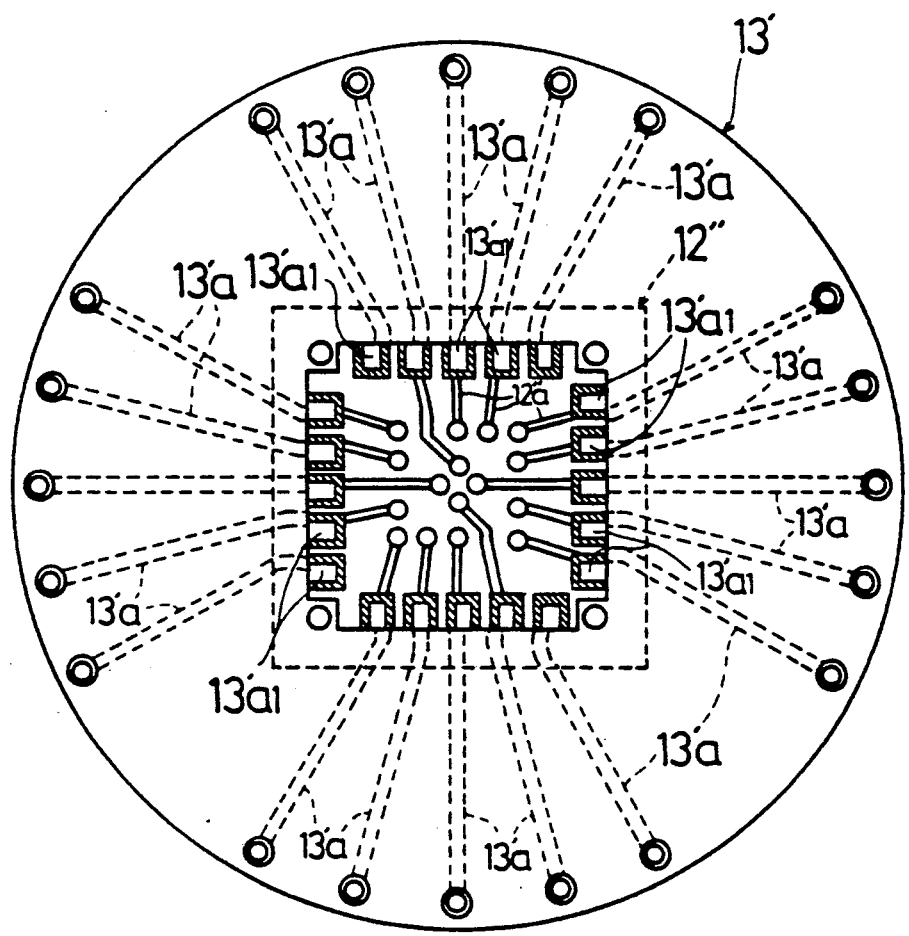
FIGS. 16 and 17 are plan views showing alternate forms of a transmission circuit substrate.
Figure 18:
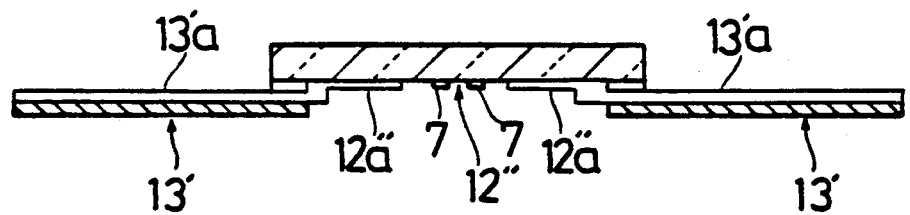
FIG. 18 is a sectional view showing connections between the insulator sheet and the transmission circuit substrate both for normal range.
Figure 17:
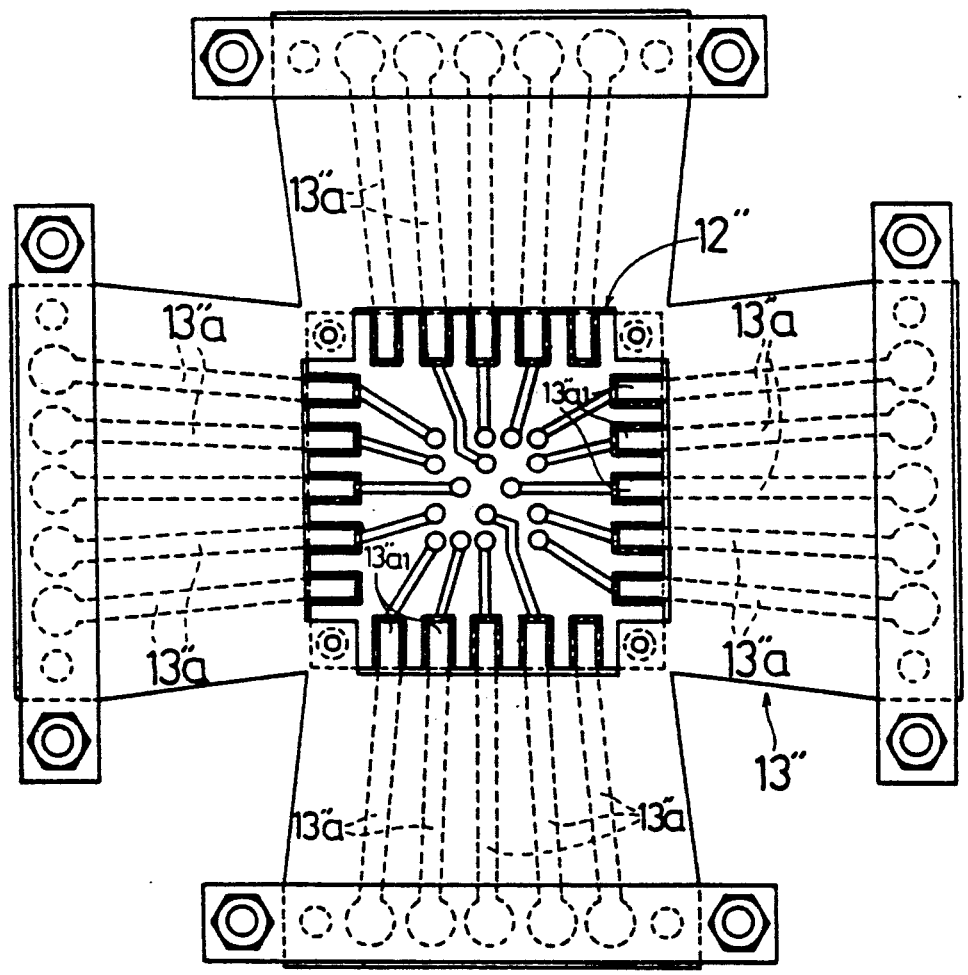
Figure 19:
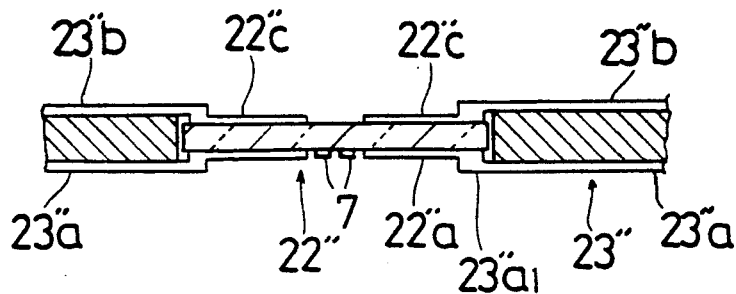
FIG. 19 is a sectional view showing connections between the insulator sheet and the transmission circuit substrate both for measuring high frequency.

FIGS. 16 and 17 show transmission circuit substrates 13', 13'' in use together with an insulator sheet 12'' for normal range. FIG. 16 adopted a circular type and FIG. 17 adopted substantially cross-shaped type. Inner end pads $13'a_1$, $13''a_1$ of each signal transmission pattern circuit 13'a, 13"a slightly project inward from the bodies of the each substrate. Connections between these signal transmission pattern circuits 13'a, 13"a and each conductive pattern circuit 12a" of the insulator sheet 12" for normal range are illustrated in FIG. 18. In the case of transmission circuit substrate 23" in use with an insulator sheet 22" for measuring high frequency, as shown in FIG. 19, inner end pads 23"$a_1$ of strip circuits 23"a are projecting sideward from the bottom surface of the body of the substrate, and ground conductors 23"b are projecting sideward from the top surface of the substrate. With this construction, the inner end pads 23"$a_1$ are connected with conductive pattern circuits 22"a of the insulator sheet 22", and the ground conductors 23"b are connected with the end portions of ground conductors 22"c of the insulator sheet 22".

Figure 20:
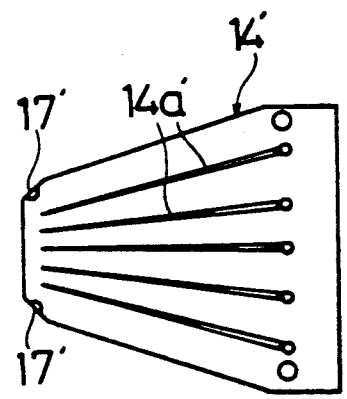
FIG. 20 is a plan view of a print circuit substrate when a print circuit substrate for normal range has taken a configuration of a division type.

FIG. 20 illustrates a division type version of the transmission circuit substrate 13 introduced in FIG. 2. A print circuit substrate 14' is shown in the case when the transmission circuit substrate is composed of four print circuit substrates 14'. This print circuit substrate 14' has a connecting portion reinforcement pattern 17' of semicircular shape.

Figure 21:
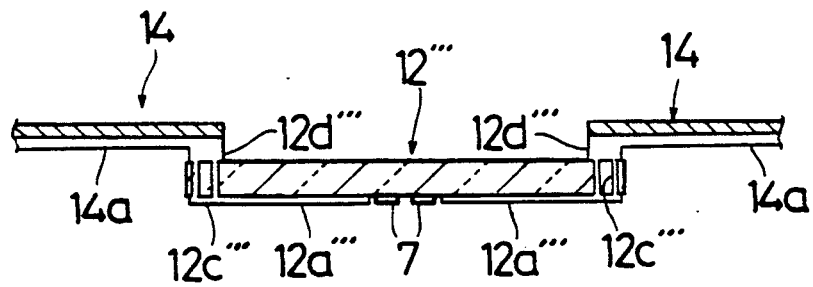
FIG. 21 is a view showing an alternate form of connections between an insulator sheet and a transmission circuit substrate both for normal range.

FIG. 21 shows an alternate form of connections between an insulator sheet 12''' and the print circuit substrate 14 both for normal range. In FIG. 6, the end portion of the print circuit substrate 14 is disposed in the lower position of the end portion of the insulator sheet 12. However, in FIG. 21, the insulator sheet 12''' and the print circuit substrate 14 are disposed in the opposite manner. Namely, the conductive pattern circuits 12a''' of the insulator sheet 12''' are provided at the end portions thereof with through-holes 12c'''. Connecting terminals 12d''' are formed on the top surface of the through-holes 12c''' through which the conductive pattern circuit 12a''' is connected with the signal transmission pattern circuits 14a of the print circuit substrate 14.

Figure 22:
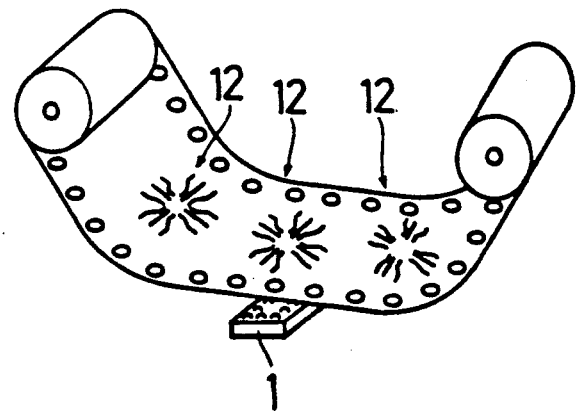
FIG. 22 is an explanatory drawing showing the case when an insulator sheet has taken a configuration of a roll type.

FIG. 22 illustrates an alternate form of the insulator sheet 12 or 22 wherein the sheet took a form of a roll having a plural number of insulator sheets thereon. In this case, the roll-type insulator sheet 12 or 22 is fed to use next insulator sheet 12 or 22 when the conductive pattern circuit wears exceeding a certain level.

The aforementioned embodiment described testing of an individual piece of semiconductor IC 1. However, the semiconductor IC 1 can be tested in the form of wafer or a chip after cutting a wafer. Further instead of testing semiconductor ICs one by one, it is possible to use a plural number of the insulator sheets 2 in order to test a plural number of chips or semiconductor ICs in the form of wafers simultaneously.

What is claimed is:

1. A device for testing a semiconductor integrated circuit, said device comprising:
   an insulator sheet having an upper surface, a lower surface, and a peripheral edge and said insulator sheet having a plurality of conductive pattern circuits which are disposed at the lower surface of the insulator sheet and which make contact with said semiconductor IC; and
   a transmission circuit substrate laterally disposed with respect to the peripheral edge of said insulator sheet so that only said conductive pattern circuits disposed at the lower surface of the insulator sheet make contact with said semiconductor IC and said transmission circuit substrate having a plurality of signal transmission pattern circuits which are connected with each conductive pattern circuit of said insulator sheet, said signal transmission pattern circuits being disposed in parallel or radially with respect to each other;
   wherein, said transmission circuit substrate is flexible and connected with a body of a testing device, and said insulator sheet is formed of a rigid deformation resistant material and arranged to be substantially parallel with said semiconductor IC when the conductive pattern circuits make contact with said semiconductor IC.

2. A device for testing a semiconductor IC as defined in claim 1 wherein said insulator sheet is covered with a conductor on the upper surface thereof.

3. A device for testing a semiconductor IC as defined in claim 1 wherein said insulator sheet is composed of transparent material and said conductive pattern circuits are composed of a transparent conductor or a metal conductor at least in portions of said insulator sheet and conductive pattern circuits where said conductive pattern circuits make contact with a plurality of bump electrodes provided on the semiconductor IC.

4. A device for testing a semiconductor IC as defined in claim 3, wherein said conductive pattern circuits are planar at least in portions thereof where contact is made with each bump electrode of the semiconductor IC.

5. A device for testing a semiconductor IC as defined in claim 1 wherein said insulator sheet is covered with a conductor on the upper surface thereof, and said insulator sheet is composed of transparent material and said conductive pattern circuits are composed of a transparent conductor or a metal conductor at least in portions of said insulator sheet and conductive pattern circuits where said conductive pattern circuits make contact with a plurality of bump electrodes provided on the semiconductor IC.

6. A device for testing a semiconductor IC as defined in claim 5, wherein said conductive pattern circuits are planar at least in portions thereof where contact is made with each bump electrode of the semiconductor IC.

7. A device for testing a semiconductor IC as defined in claim 1, wherein bump electrodes are formed on said conductive pattern circuits for making contact with said semiconductor IC.

8. A device for testing a semiconductor IC as defined in claim 1, wherein bump electrodes are formed on said semiconductor IC for making contact with said conductive pattern circuit.

9. A method of testing a semiconductor integrated circuit comprising the steps of:
   providing a rigid deformation resistant insulator sheet having an upper surface, a lower surface, and a peripheral edge;
   bringing a plurality of conductive pattern circuits formed on the lower surface of said rigid deformation resistant insulator sheet into contact with a plurality of bump electrodes formed on a substrate of the semiconductor IC in a manner such that the insulator sheet is substantially parallel with said substrate;
   connecting a plurality of signal transmission pattern circuits formed on a flexible transmission circuit substrate with each conductive pattern circuit of said insulator sheet where the flexible transmission circuit substrate is laterally disposed with respect to the peripheral edge of the insulating sheet so that only said conductive pattern circuits disposed at the lower surface of the insulator sheet make contact with said semiconductor IC; and
   connecting said transmission circuit substrate with a body of a testing device.

* * * * *